United States Patent [19]

Wada

[11] Patent Number: 5,219,776

[45] Date of Patent: Jun. 15, 1993

[54] METHOD OF MANUFACTURING SEMICONDUCTOR DEVICE

[75] Inventor: Sakae Wada, Kashihara, Japan

[73] Assignee: Sharp Kabushiki Kaisha, Osaka, Japan

[21] Appl. No.: 737,029

[22] Filed: Jul. 29, 1991

[30] Foreign Application Priority Data

Jul. 30, 1990 [JP] Japan .................................. 2-204855

[51] Int. Cl.$^5$ ..................... H01L 21/265; H01R 21/22
[52] U.S. Cl. ........................................ 437/43; 437/45; 437/48; 437/150
[58] Field of Search ................. 437/52, 45, 27–30, 437/931, 35, 41, 43, 48; 357/23.12, 90

[56] References Cited

U.S. PATENT DOCUMENTS

| | | | |
|---|---|---|---|
| 4,356,042 | 10/1982 | Gedaly et al. ................. | 148/1.5 |
| 4,395,725 | 7/1983 | Parekh .............................. | 357/23.12 |
| 4,494,995 | 1/1985 | Tabatabaie-Alavi et al. ....... | 357/90 |
| 4,513,494 | 4/1985 | Batra ................................. | 357/23.12 |
| 4,818,716 | 4/1989 | Okuyama et al. ................... | 437/45 |
| 4,889,820 | 12/1989 | Mori .................................. | 437/35 |
| 4,890,147 | 12/1989 | Teng et al. ......................... | 357/90 |
| 4,898,840 | 2/1990 | Okuyama ............................. | 437/41 |
| 4,937,075 | 6/1990 | Hollingsworth et al. ........... | 437/45 |
| 5,019,520 | 5/1991 | Komori et al. ..................... | 437/45 |

FOREIGN PATENT DOCUMENTS

| | | | |
|---|---|---|---|
| 0073130 | 3/1983 | European Pat. Off. ............ | 437/45 |
| 57-36863 | 2/1982 | Japan ................................ | 437/29 |
| 58-95848 | 6/1983 | Japan . | |

*Primary Examiner*—Olik Chaudhuri
*Assistant Examiner*—Loc Q. Trinh

[57] ABSTRACT

A method of manufacturing a semiconductor device is manufactured as a MOS-type mask ROM in which the threshold voltage in a transistor used as a memory cell varies from stage to stage by ion implantation. As a result, a period for storing data can be shortened by writing data in the late stage of the manufacturing process, and specified ions are implanted with multi-stage energy with a gate electrode of the transistor covered with an insulating film of a layer insulating film or of a layer insulting film and a protective film to vary the threshold voltage stably.

16 Claims, 5 Drawing Sheets

5,219,776

METHOD OF MANUFACTURING SEMICONDUCTOR DEVICE

BACKGROUND OF THE INVENTION

Field of the Invention

The present invention relates to a method of manufacturing a semiconductor device, and more particularly, it relates to a method of manufacturing a MOS-type mask ROM in which threshold voltage in a transistor used as a memory cell is varied from stage to stage by ion implantation, so that a period for storing data can be shortened by writing data in the late stage of the manufacturing process.

Description of the Related Art

In general, in a MOS-type mask ROM, a transistor in a memory cell is set at a fixed threshold value in advance. After that, specified ions are implanted selectively corresponding to data in a channel region under a gate electrode, and data writing is carried out by varying the threshold value by raising the threshold value to turn the transistor from ON to OFF for example. In some cases, the threshold value may be lowered for the same purpose. The data writing is performed at the late same purpose. The data writing is performed at the late stage of the semiconductor manufacturing process to shorten a period for writing data. In order to set the stage, specified ions are implanted with a gate electrode covered with an insulating film or covered with an insulating film and a protective film deposited one after another.

However, even if the insulating film, the protective film and the like, is formed over the entire surface of a semiconductor substrate including the gate electrode, each of the gate electrode, the insulating film, the protective film and the like may be uneven in film thickness or vary in film thickness from part to part. Moreover, when the insulating film has a multi-stratum structure or has a multi-stratum structure further including a protective film deposited on it, the whole insulating film becomes more uneven in thickness. Then, ions implanted on the assumption that the insulating film of the multi-stratum structure has an even fixed thickness do not reach a channel region under the gate electrode stably and evenly. Consequently, the intended threshold value cannot be obtained stably, and the problems on the operation of the transistor arise.

Specifically, in implanting specified ions into the channel region under the gate electrode with the gate electrode covered with the insulating film, generally, an implantation curve m as shown in FIG. 8 may be employed in order to implement the optimum implantation profile of the channel region in a single stage on the assumption that the insulating film has a fixed thickness. In FIG. 8, a horizontal axis X indicates a depth of the channel region, $X=0$ indicates the surface of the channel region, and $X>0$ indicates the depth extending from the surface of the channel region toward and into the Si substrate where the channel region is formed. $X<0$ indicates the total thickness from the surface of the channel region toward the films on the channel region of which the insulating film of multi-stratum structure is composed. A vertical axis indicates an impurity (boron B) concentration. The threshold value can be determined by controlling a surface concentration $C_0$ ($=C_{max}$) in the surface of the channel region. A symbol t indicates the total thickness of the films existing on and above the channel region; that is, it indicates the total thickness of the films from a bottom surface 10a of a gate insulating film 10 on a Si substrate i including a channel region R through a gate electrode 5 on it and a first insulating film 3 up to an upper surface 4a of a second insulating film 4 (FIG. 1). In this embodiment, the thickness t satisfies $t=T_0$ (fixed).

In accordance with this method, when the gate electrode is covered with a thin insulating film of a multi-stratum structure of thickness t which is equal to $T_1$ and is smaller than $T_0$, as shown in FIG. 9, impurities are deeply implanted into the Si substrate 1, and a concentration $C_1$ ($=C_{min}$) of a surface of the Si substrate 1 (a surface of the channel region) becomes thinner. When the insulating film of a multi-stratum structure is a thicker film of thickness t which is equal to $T_2$ and is larger than $T_0$, as shown in FIG. 10, impurities may hardly reach the Si substrate 1, and eventually, an amount of impurities cannot be stably supplied to the channel region R. This causes the channel region to have a constant surface concentration, and thus, a specified threshold value cannot be obtained stably.

The surface concentration of the channel region R varies between $C_{min}$ and $C_{max}$ dependent upon the thickness t, and accordingly, the threshold value considerably varies.

Conventionally, to avoid the problem, a method of etching away an insulating film or a protective film on a gate electrode and thereafter implanting ions or a method of implanting ions into a thin insulating film has been employed. However, according to the method, the insulating film on the gate electrode becomes unnecessarily thin, and the reliability of the resultant device is lost. Additionally, merely thinning the insulating film on the gate electrode cannot thoroughly solve the problems caused by unevenness of the film thickness.

SUMMARY OF THE INVENTION

Thus, the present invention provides a method of manufacturing a semiconductor device, characterized in that in manufacturing a MOS-type mask ROM in which threshold voltage in a transistor used as a memory cell varies from stage to stage by ion implantation. As a result, a period for storing data can be shortened by writing data in the late stage of the manufacturing process, and specified ions are implanted with multi-stage energy with a gate electrode of the transistor covered with an insulating film or an insulating film and a protective film to vary the threshold voltage stably.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAIL DESCRIPTION OF THE PREFERRED EMBODIMENTS

A major characteristic of the present invention is that threshold voltage is varied by implanting specified ions with multiple-stage energy under the condition that a gate electrode of a transistor is covered with an insulating film or an insulating film and a protective film.

In accordance with the present invention, even if a thick insulating film above a channel region in a gate electrode covers the gate electrode in the late stage of a process of manufacturing a semiconductor, a flat region having almost an even concentration can be defined with a large area by ion implantation for data writing with multi-stage implanting energy. This enables the variation in surface concentration to become small related to the variation in film thickness and also enables the variation in the corresponding threshold to become small, so that the data writing can be stably performed by the ion implantation. Eventually, a mask ROM where data can be stored rapidly can be manufactured.

In other words, in the present invention, a plurality of implanting energies are determined so as to make implantation profiles more flat, and ions are implanted at a time so that an impurity concentration of the channel region can be made substantially flat; that is, a stable threshold can be obtained.

According to the present invention, ions can be implanted with a thick insulating film above a gate electrode, and a stable threshold can be obtained without varying some factors which might cause problems of reliability even with uneven film thickness. Thus, data writing can be carried out at the late stages of the manufacturing process, and a period of time required for storing data in a mask ROM can be shortened.

Now, the present invention will be explained in detail in conjunction with preferred embodiments shown in the accompanying drawings. However, the present invention is not limited to the precise form of the explanation.

In a preferred embodiment, when specified ions are implanted through an insulating film into a channel region with multi-stage energy, a device (MOS-type mask ROM) into which the ions are implanted is classified into two categories as follows:
  (i) a device which has an insulating film; and
  (ii) a device which has an insulating film and a protective film.

In this embodiment, for example, the device in the category (i) has a double-stratum gate electrode consisting of an underlayer polysilicon (poly-Si) of about 1500 Å thickness and an overlayer tungsten silicide (WSi) of about 2000 Å thickness, and an insulating film of 5000 Å to 8000 Å thickness consisting of an overlayer BPSG film and an underlayer NSG film.

Also, the device in the category (ii) has a plasma enhanced SiN film (protective film) of 4000 Å to 6000 Å thickness besides the gate electrode and the insulating film.

An embodiment of the present invention in the case of two-stage implantation where implanting energy is introduced in two stages will be described.

Figure 1:
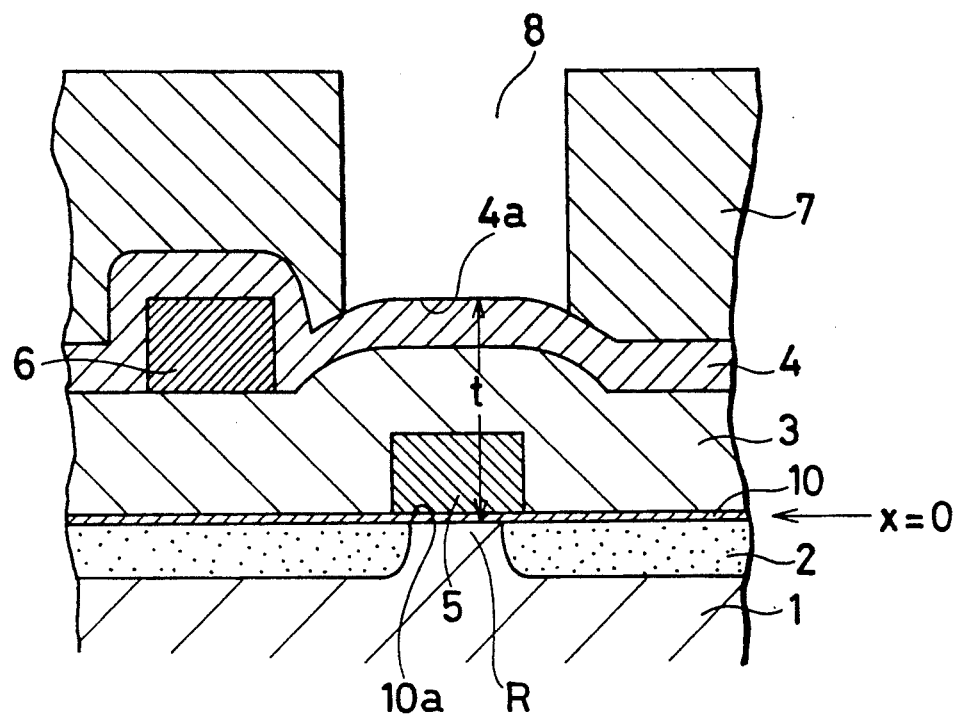
FIG. 1 is a diagram showing a configuration of a MOS-type mask ROM, which is employed for explaining an embodiment according to the present invention.
Figure 2:
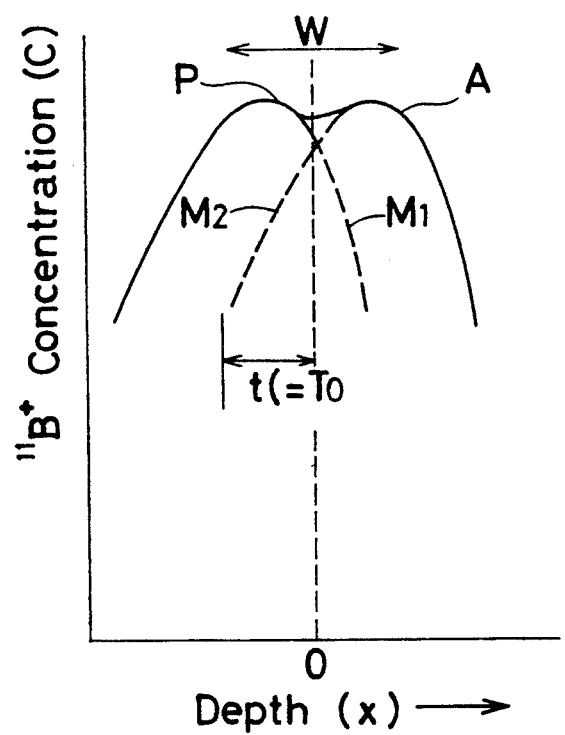
FIGS. 2 to 4 are diagrams showing profiles of two-stage doping steps, which is for explaining the embodiment according to the present invention.
Figure 8:
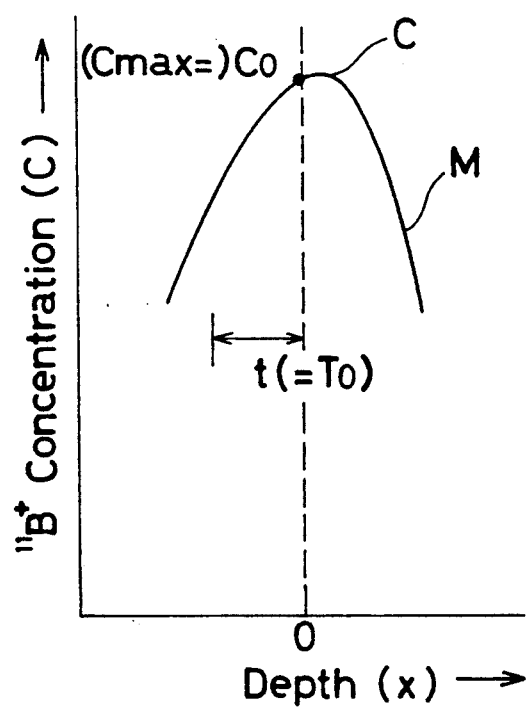
FIGS. 8 to 10 are diagrams showing profiles of single-stage doping steps in a prior art embodiment.
Figure 9:
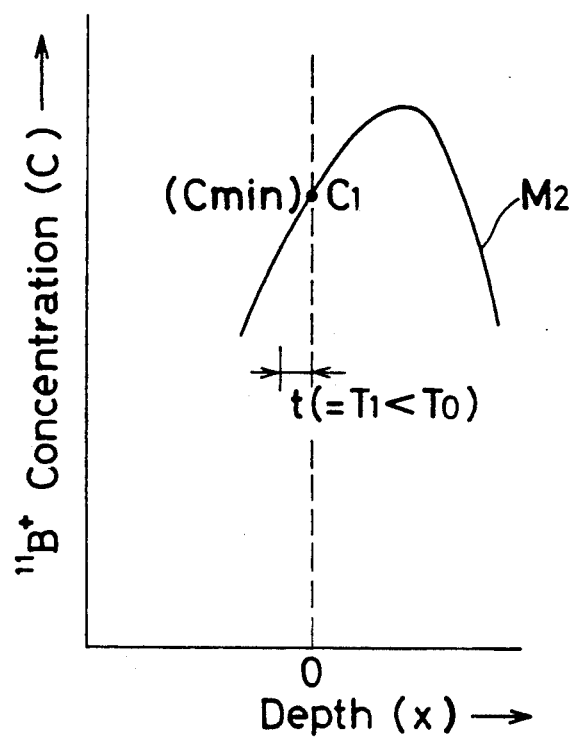
Figure 10:
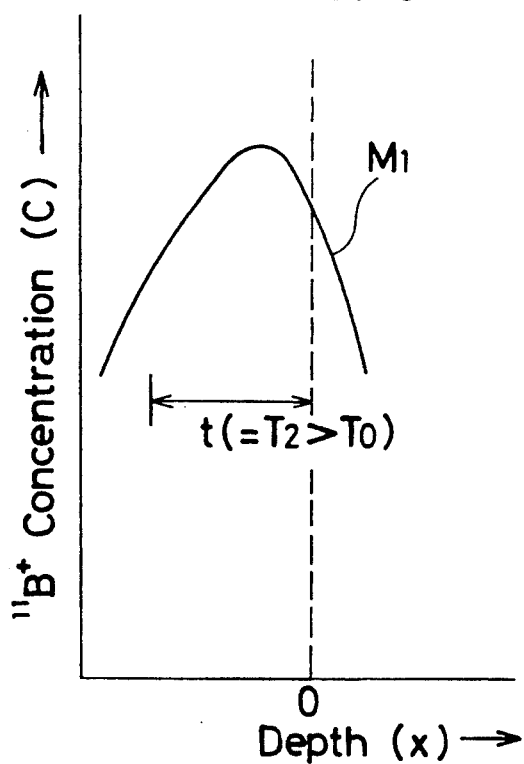

First, as shown in FIG. 1, a transistor is formed on a Si substrate 1 by an ordinary step. After the formation of the transistor, an opening is formed above a specified transistor alone by photolithography, ions are implanted, and a threshold is preset. In this embodiment, $^{11}B^+$ is implanted to raise the threshold. The $^{11}B^+$ is implanted through a gate electrode 5, an insulating film 3 and a protective film 4. At this time, the optimum implantation profile in a channel region is an implantation curve A related to ions introduced on the assumption of a fixed thickness t ($=T_0$: for example, 15,000 Å), which is a curve composed of two separate implantation curves $M_1$ and $M_2$ as shown in FIG. 2. A segment P which is almost flat in an upper face of the curve A compared with the peak C of a curve M (see FIG. 8) has a width W.

Figure 3:
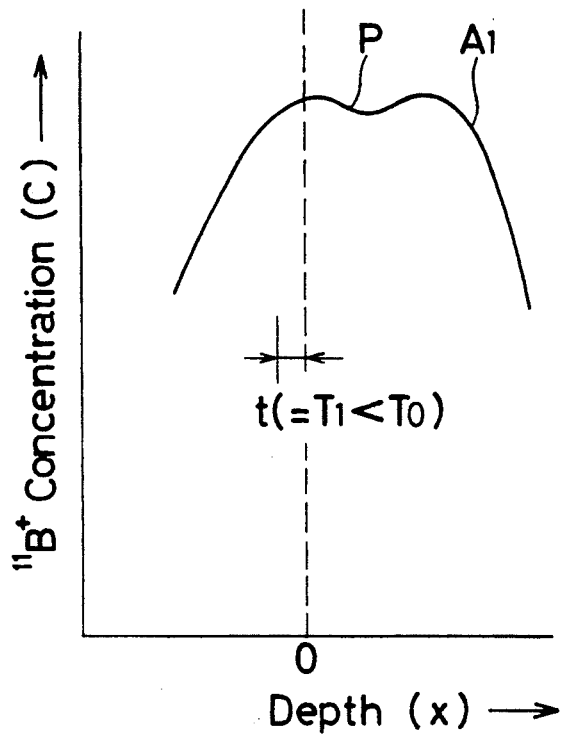

Then, with regard to the device of the category (i) which is a thin film having a thickness t of $T_1$ (12,500 Å) and is smaller than $T_0$ (15,000 Å), as shown in FIG. 3, a curve $A_1$ has a form obtained by translating the curve A in FIG. 2 in a depthwise direction (X<0) and also has an implantation profile where a flat segment P appears in the range corresponding to the channel region R and the Si substrate.

Figure 4:
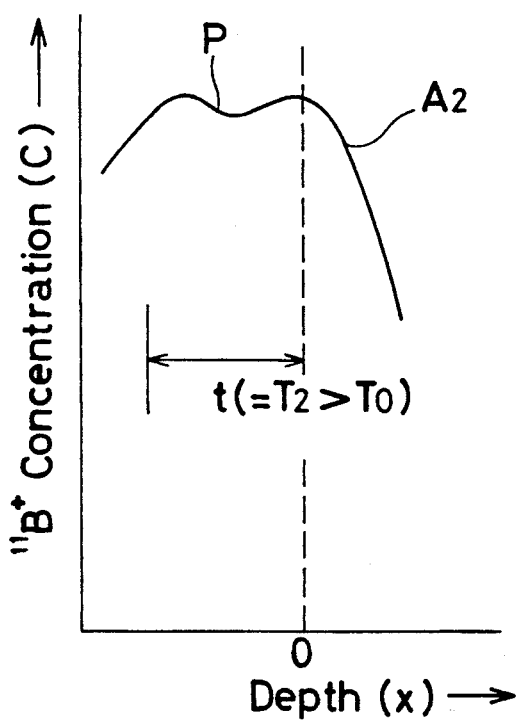

With regard to the device of the category (ii) which is a thicker film having a thickness t of $T_2$ (17,500 Å) and is larger than $T_0$ (see FIG. 1), as shown in FIG. 4, a curve $A_2$ has a form obtained by translating the curve A in FIG. 2 in a reverse direction (X>0) to the depthwise direction and also has an implantation profile where a flat segment P appears in the range corresponding to the channel region and the Si substrate.

The two-stage implanting conditions in the case (i) is as follows: Preferably, the implanting energy is 300 to 450 Kev in an implantation curve $M_1$ found at the first implantation, while preferably, the implanting energy is 450 to 600 Kev in an implantation curve $M_2$ found at the second stage. At this time, however, it is preferable that the implantation energies are introduced with an energy difference of 100 Kev or more between the first and second stages.

In both the curves $M_1$ and $M_2$, the ion implantation doses are identical in amount, preferably, $8 \times 10^{13}$ to $3 \times 10^{14}$ ions/cm$^2$.

On the other hand, in the case (ii), the implanting energy of the implantation curve $M_1$ is preferably 600 Kev to 700 Kev while the implantation energy of the implantation curve $M_2$ is preferably 700 Kev to 900 Kev. Furthermore, in both the curves $M_1$ and $M_2$, the introduced energies are identical in amount; preferably, $8 \times 10^{13}$ to $3 \times 10^{14}$ ions/cm$^2$ which is similar to the case (i).

Thus, in this embodiment, in a process of making a mask ROM, implantation for data writing is carried out by introducing the implanting energy in two stages. Therefore, stable writing can be performed without effecting the thickness of an insulating film and the like on the channel, and a stable desired threshold can be obtained.

Figure 5:
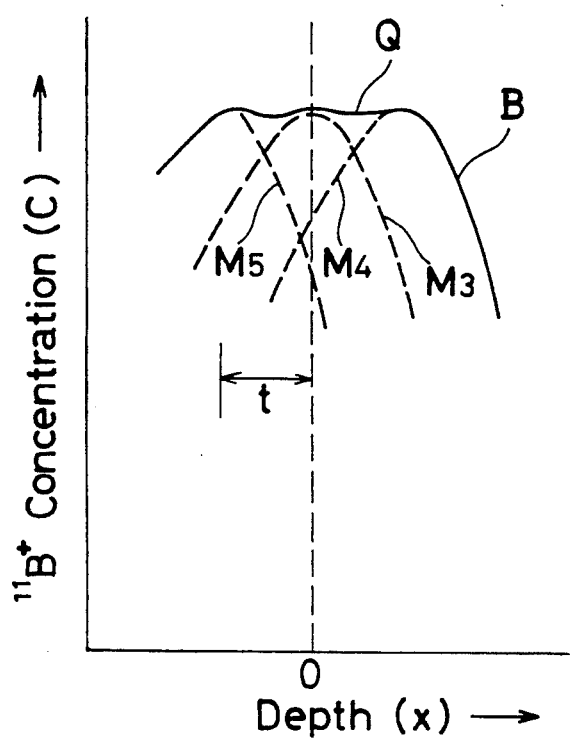
FIGS. 5 to 7 are diagrams showing profiles of three-stage doping steps, which is for explaining another embodiment according to the present invention.
Figure 6:
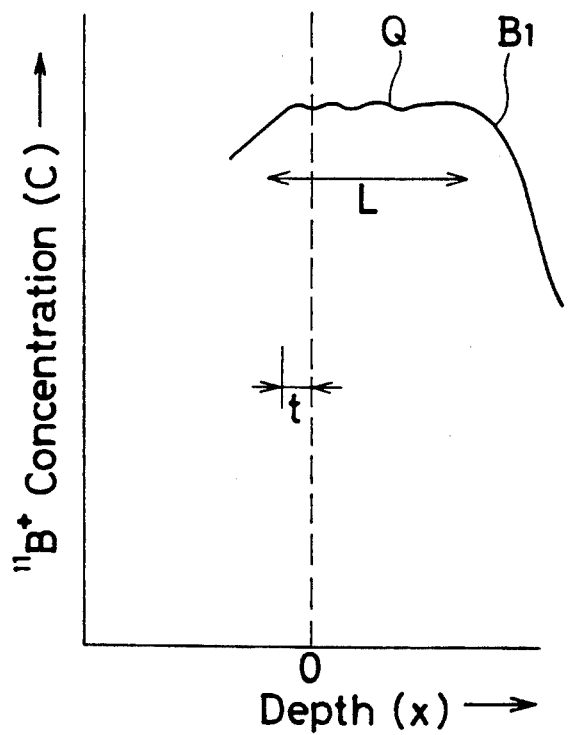
Figure 7:
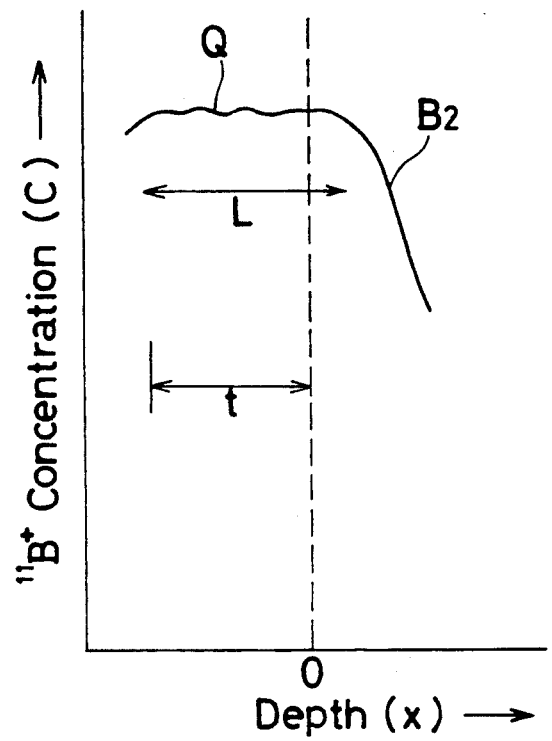

While two-stage implantation is employed in this embodiment, an implanting energy may be introduced in three stages. Employed as an implantation profile is a curve B, a curve composed of three separate implantation curves $M_3$, $M_4$ and $M_5$, which are drawn in the implantations at the first to the third stages, respectively, as shown in FIGS. 5 to 7. Employing such a profile, a flat segment Q of almost a fixed concentration is found with a length L (>W) in each case of a curve $B_1$ with a thickness t ($=T_1<T_0$) and a curve $B_2$ with a thickness t ($T_2>T_0$), and this allows a variation in the surface concentration (channel concentration) related to a concentration of the film thickness to become smaller and also allows a variation of the corresponding threshold to become small and stable.

As has been described, according to the present invention, even if a thick insulating film above a channel region in a gate electrode covers the gate electrode in the late stage of a process of manufacturing a semiconductor, a flat region having almost an even concentration can be defined with a large area by ion implantation for data writing with multi-stage implanting energy. This enables the variation in the surface concentration to become small related to the variation in film thickness and also enables the variation in the corresponding threshold to become small, so that the data writing can be stably performed by the ion implantation. Eventually, a mask ROM where data can be stored rapidly can be manufactured.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a semiconductor device including a MOS-type mask ROM having at least a semiconductor substrate, a gate electrode and an insulating layer covering the gate electrode comprising the step of multi-stage ion implanting with only one conductivity type of ions, each stage implanting energy being of a different amount and each stage implanting an identical dosage to said semiconductor substrate through the gate electrode of a transistor used as a memory cell covered with the insulating layer comprising an insulating film or an insulating film and a protective film, so as to make an impurity concentration distribution substantially flat at a substrate surface and in the vicinity thereof and to make the deviation and dispersion of a predetermined threshold voltage of said transistor change stably by a small amount.

2. A method according to claim 1, wherein said gate electrode has a double-layer structure comprising an underlayer polysilicon (poly-Si) and an overlayer tungsten silicide (WSi), and said insulating film comprises an overlayer BPSG film and an underlayer NSG film.

3. A method according to claim 1, wherein said gate electrode has a double-layer structure comprising an underlayer polysilicon (poly-Si) and an overlayer tungsten silicide (WSi), said insulating film comprises an overlayer BPSG film and an underlayer NSG film, and said protective film is formed of an SiN film deposited on said layer insulating film.

4. A method according to claim 1, wherein the conductivity type of said one conductivity type of ions implanted is the same as the conductivity type of an impurity contained in the semiconductor substrate.

5. A method of manufacturing a semiconductor device including a MOS-type mask ROM having at least a semiconductor substrate, a gate electrode and an insulating layer covering the gate electrode, comprising the steps of:

forming transistors of the device comprising gate electrodes covered with said insulating layer formed of an insulating film or an insulating film and a protective film on a substrate;

forming an opening for ion implanting therethrough at predetermined ones of said transistor over said gate electrodes and said insulating layer by photolithography; and multi-stage ion implanting with only one conductivity type of ions, each stage implanting energy being of a different amount and each stage implanting an identical dosage to said semiconductor substrate through said opening, said insulating layer and said gate electrodes for said predetermined ones of said transistors so as to make an impurity concentration distributing substantially flat at a substrate surface and in the vicinity thereof and to make the deviation and dispersion of a predetermined threshold voltage change stably by a small amount.

6. A method according to claim 5, wherein the conductivity type of said one conductivity type of ions implanted is the same as the conductivity type of an impurity contained in the semiconductor substrate.

7. A method according to claim 5, wherein said step of multi-stage ion implanting comprises two stages.

8. A method according to claim 7, wherein said two stages comprise a first stage of a first implanting energy and a first implantation curve for obtaining a first ion concentration distribution and a second stage of a second implanting energy and a second implantation curve for obtaining a second ion concentration distribution.

9. A method according to claim 8, wherein said transistors comprise the gate electrodes with said insulating film and said protective film of said insulating layer.

10. A method according to claim 9, wherein an implantation energy difference between said first implanting energy for said first stage and said second implanting energy for said second stage is 100 Kev or more.

11. A method according to claim 10, wherein the ion implantation doses in said first and second implantation curves are in a range of $8 \times 10^{13}$ to $3 \times 10^{14}$ ions/cm$^2$, said first implanting energy for said first stage is 300 to 450 Kev and said second implanting energy for said second stage is 450 to 600 Kev.

12. A method according to claim 8, wherein said transistors comprise the gate electrodes with said insulating film and said protective film.

13. A method according to claim 12, wherein an implantation energy difference between said first implanting energy for said first stage and said second implanting energy for said second stage is 100 Kev or more.

14. A method according to claim 13, wherein the ion implantation doses in said first and second implantation curves are in a range of $8 \times 10^{13}$ to $3 \times 10^{14}$ ions/cm$^2$, said first implanting energy for said first stage is 600 to 700 Kev and said second implanting energy for said second stage is 700 to 900 Kev.

15. A method according to claim 5, wherein said step of multi-stage ion implanting comprises three stages.

16. A method according to claim 15, wherein said three stages comprise a first stage of a first implanting energy and a first implantation curve for obtaining a first ion concentration distribution, a second stage of a second implantation energy and a second implantation curve for obtaining a second ion concentration distribution, and a third stage of a third implantation energy and a third implantation curve for obtaining a third ion concentration distribution.

* * * * *